United States Patent
Huang et al.

(10) Patent No.: US 10,812,094 B2
(45) Date of Patent: Oct. 20, 2020

(54) CALIBRATION METHOD APPLIED TO DIGITAL-TO-ANALOG CONVERTER AND ASSOCIATED CIRCUIT

(71) Applicant: Realtek Semiconductor Corp., HsinChu (TW)

(72) Inventors: Bi-Ching Huang, Hsinchu (TW); Yu-Chang Chen, New Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/544,931

(22) Filed: Aug. 20, 2019

(65) Prior Publication Data

US 2020/0162091 A1    May 21, 2020

(30) Foreign Application Priority Data

Nov. 16, 2018  (TW) .............................. 107140710 A

(51) Int. Cl.
*H03M 1/10* (2006.01)
*H03M 1/06* (2006.01)

(52) U.S. Cl.
CPC ....... *H03M 1/1023* (2013.01); *H03M 1/0607* (2013.01)

(58) Field of Classification Search
CPC ..... H03M 1/1023; H03M 1/0607; H03M 1/66
USPC ......................................... 341/118, 120, 144
See application file for complete search history.

(56) References Cited

U.S. PATENT DOCUMENTS

| 5,818,370 | A | 10/1998 | Sooch | |
|---|---|---|---|---|
| 6,888,481 | B2 * | 5/2005 | Itoh | H03M 1/1019 341/118 |
| 8,659,456 | B2 * | 2/2014 | Chang | H03K 5/007 341/120 |

FOREIGN PATENT DOCUMENTS

| TW | 200533085 | 10/2005 |
|---|---|---|
| TW | I355829 | 1/2012 |
| TW | 201810954 A | 3/2018 |

* cited by examiner

*Primary Examiner* — Khai M Nguyen
(74) *Attorney, Agent, or Firm* — Winston Hsu

(57) ABSTRACT

The present invention provides a calibration method applied to a DAC, wherein the calibration method includes the steps of: generating a first digital input signal to the DAC to generate a first analog signal; using an ADC to generate a first digital output signal according to the first analog signal; generating a second digital input signal to the DAC to generate a second analog signal; swapping a polarity of the second analog signal to generate a swapped signal; using the ADC to generate a second digital output signal according to the swapped signal; and generating a digital calibration signal according to the first digital output signal and the second digital output signal, to control a calibration circuit to generate an analog calibration signal or to determine a polarity direction of a DC offset that is to be calibrated.

18 Claims, 5 Drawing Sheets

CALIBRATION METHOD APPLIED TO DIGITAL-TO-ANALOG CONVERTER AND ASSOCIATED CIRCUIT

BACKGROUND OF THE INVENTION

1. Field of the Invention

The present invention relates to a digital-to-analog converter (DAC), and more particularly, to a calibration method applied to the DAC and associated circuit.

2. Description of the Prior Art

In a communication system, a DAC has a DC offset due to a non-ideal effect, so that the analog signal outputted by the DAC has the DC offset and affects the signal quality. In order to eliminate the DC offset of the DAC, some improvement methods have been proposed. In a Republic of China Patent Publication No. TW200533085 a two-point interpolation method is proposed to compensate the DC offset of the DAC, however, this method compensates the DC offset at input terminals of the DAC and therefore affects a digital input signal range of the DAC. In addition, the Republic of China Patent No. TWI355829 mentions an analog-type DC offset calibration method, however, DC offset of analog-to-digital converter (ADC) in the calibration path appears at DAC output after DC offset calibration, which dominates the offset error when its requirement is stringent.

SUMMARY OF THE INVENTION

It is therefore an objective of the present invention to provide a calibration circuit and a calibration method applied to the DAC, which can avoid affecting the input signal range of the DAC, and can also prevent the DC offset of the ADC from affecting the DC offset calibration of the DAC, to solve the above-mentioned problems.

According to one embodiment of the present invention, a calibration method applied to a DAC is disclosed, wherein the calibration method comprises the steps of: generating a first digital input signal to the DAC to generate a first analog signal; using an ADC to generate a first digital output signal according to the first analog signal; generating a second digital input signal to the DAC to generate a second analog signal; swapping a polarity of the second analog signal to generate a swapped signal; using the ADC to generate a second digital output signal according to the swapped signal; and generating a digital calibration signal according to the first digital output signal and the second digital output signal, to control a calibration circuit to generate an analog calibration signal or to determine a polarity direction of a DC offset that is to be calibrated.

According to another embodiment of the present invention, a circuit applied in a DAC is disclosed, wherein the circuit comprises a control circuit, a polarity swapping circuit, an ADC and a calibration circuit. In the operations of the circuit, the control circuit is configured to generate a first digital input signal and a second digital input signal to the DAC to generate a first analog signal and a second analog signal, respectively. The polarity swapping circuit is configured to swap a polarity of the second analog signal to generate a swapped signal. The ADC is configured to generate a first digital output signal according to the first analog signal, and to generate a second digital output signal according to the swapped signal. The control circuit is configured to generate a digital calibration signal according to the first digital output signal and the second digital output signal, to control the calibration circuit to generate an analog calibration signal or to determine a polarity direction of a DC offset that is to be calibrated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
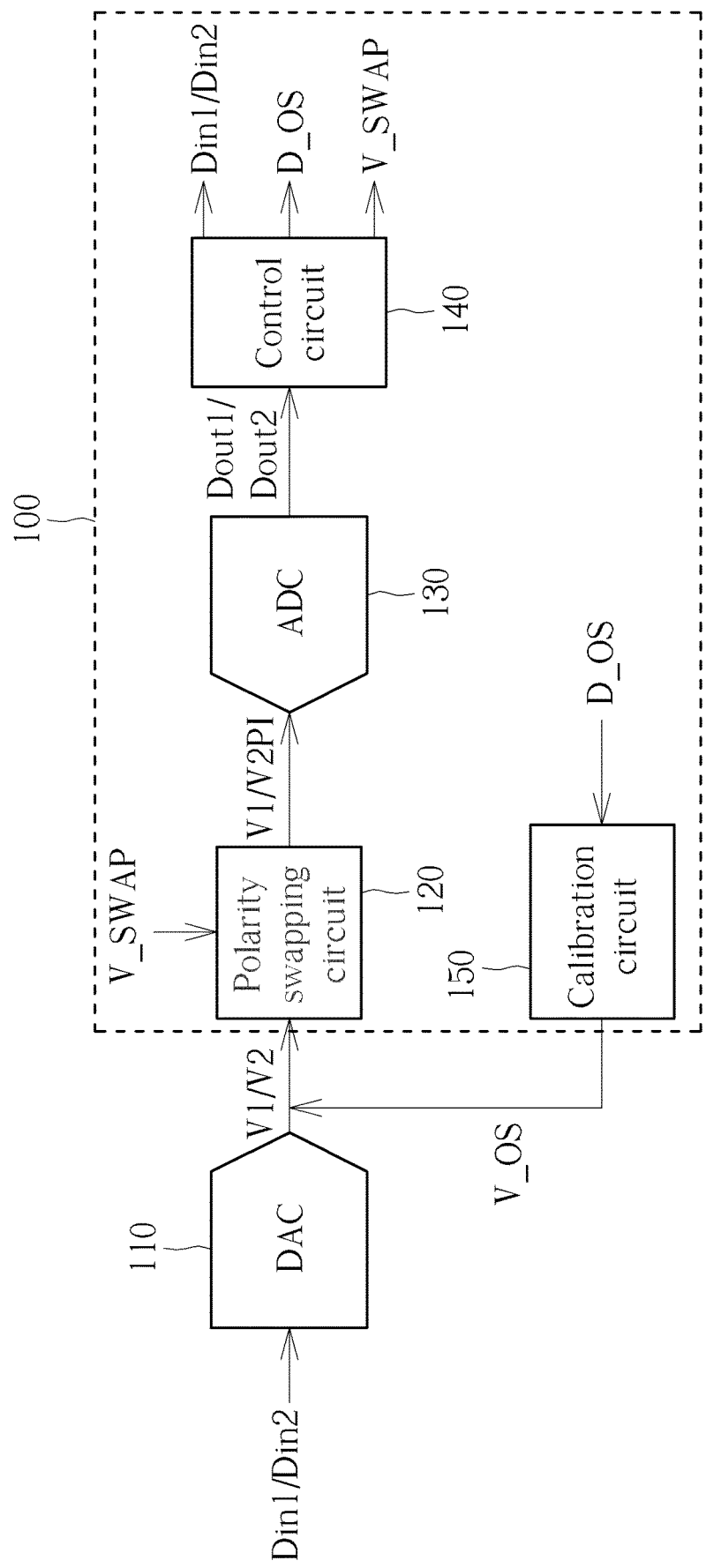
FIG. 1 is a diagram illustrating a circuit for calibrating a DAC according to one embodiment of the present invention.

FIG. 1 is a diagram illustrating a circuit 100 arranged to calibrate a DAC 110 according to one embodiment of the present invention. As shown in FIG. 1, the circuit 100 comprises a polarity swapping circuit 120, an ADC 130, a control circuit 140 and a calibration circuit 150. In this embodiment, the DAC 110 and the circuit 100 are positioned in a transmitter or a transceiver within a communication device.

In the embodiment shown in FIG. 1, the circuit 100 is used to calibrate the DAC 110 to compensate the DC offset of the DAC 110 during a specific time, such as when the communication device is powered on. After the calibrations are completed, the circuit 100 can be disabled, and the output of the DAC 110 can be directly used by other components within the communication device.

In the operations of the circuit 100, firstly, the control circuit 140 generates a first digital input signal Din to the DAC 110 to generate a first analog signal V1, and at this time the control circuit 140 generates a control signal V_SWAP to disable the polarity swapping circuit 120 to directly transmit the first analog signal V1 to the ADC 130. Then, the ADC 130 performs analog-to-digital operations upon the first analog signal V1 to generate a first digital output signal Dout1 to the control circuit 140. In this embodiment, the first digital input signal Din1 may be an intermediate value of a digital input code range of the DAC 110 plus a digital offset value. Specifically, assuming that the output voltage range of the DAC 110 is ranging from (−1)V to 1 V, the output voltage corresponding to the intermediate value of the digital input code range is an intermediate value of the output voltage range (i.e. 0V), and the digital offset value can correspond to any suitable output voltage. In this embodiment, the first analog signal V1 can be expressed as: $V1=A+\Delta A+OS\_DAC$, wherein "A" is the voltage corresponding to the intermediate value of the digital input code range, "$\Delta A$" is the voltage corresponding to the digital offset value, and "OS_DAC" is the DC offset of the DAC 110. The first analog signal V1 received by the ADC 130 plus its own DC offset OS_ADC can be expressed as follows: $X1=A+\Delta A+OS\_DAC+OS\_ADC$, and the first digital output signal Dout1 is the digital data of the analog value X1.

Then, the control circuit 140 generates a second digital input signal Din2 to the DAC 110 to generate a second analog signal V2, and at this time the control circuit 140 generates the control signal V_SWAP to enable the polarity swapping circuit 120 to swap the polarity of the second analog signal V2 (e.g. swapping based on the intermediate value 0V as a reference) to generate a swapped signal V2PI to the ADC 130. Then, the ADC 130 performs the analog-to-digital converting operations upon the swapped signal V2PI to generate a second digital output signal Dout2 to the control circuit 140. In this embodiment, the second digital input signal Din2 may be the intermediate value of the digital input code range of the DAC 110 minus the digital offset value. In this embodiment, the second analog signal V2 can be expressed as: V2=A−ΔA+OS_DAC, and the swapped signal V2PI can be expressed as follows: V2PI=A+ΔA−OS_DAC (in this embodiment, swapping based on the voltage "A"). The swapped signal V2PI received by the ADC 130 plus its own DC offset OS_ADC can be expressed as follows: X2=A+ΔA−OS_DAC+OS_ADC, and the second digital output signal Dout2 is the digital data of the analog value X2.

Then, the control circuit 140 subtracts the first digital output signal Dout1 and the second digital output signal Dout2 to obtain the information of the DC offset "OS_DAC", and the DC offset OS_ADC of the ADC 130 can be completely removed in this calculation. Therefore, the control circuit 140 can calculate or look up the table according to the obtained DC offset OS_DAC of the DAC 110 to determine the calibration degree or the polarity direction of the compensation required by the DAC 110, to generate a digital calibration signal D_OS. The digital calibration signal D_OS is provided to the calibration circuit 150 to generate an analog calibration signal V_OS to compensate the output signal at the output terminal of the DAC 110.

As described above, by using the operations of the above embodiment, the DC offset calibration of the DAC 110 may not be affected by the DC offset of the ADC 130. In addition, because the calibration circuit 150 is configured to compensate the analog output signal of the DAC 110, it can avoid affecting the input range of the DAC 110.

It should be noted that the time points for generating the first digital output signal Dout1 and the second digital output signal Dout2 are interchangeable, that is, the control circuit 140 may first generate the second digital input signal Din2 for the ADC 130 to generate the second digital output signal Dout2, then the first digital input signal Din1 is generated for the ADC 130 to generate the first digital output signal Dout1. In another embodiment, in the process of generating the first digital output signal Dout1, the control circuit 140 may generate the control signal V_SWAP to enable the polarity swapping circuit 120, and in the process of generating the second digital output signal Dout1, the control circuit 140 may generate the control signal V_SWAP to disable the polarity swapping circuit 120. As long as the DC offset of the ADC 130 can be eliminated by subtracting the first digital output signal Dout1 from the second digital output signal Dout2, these alternative designs shall fall within the scope of the present invention.

Figure 2:
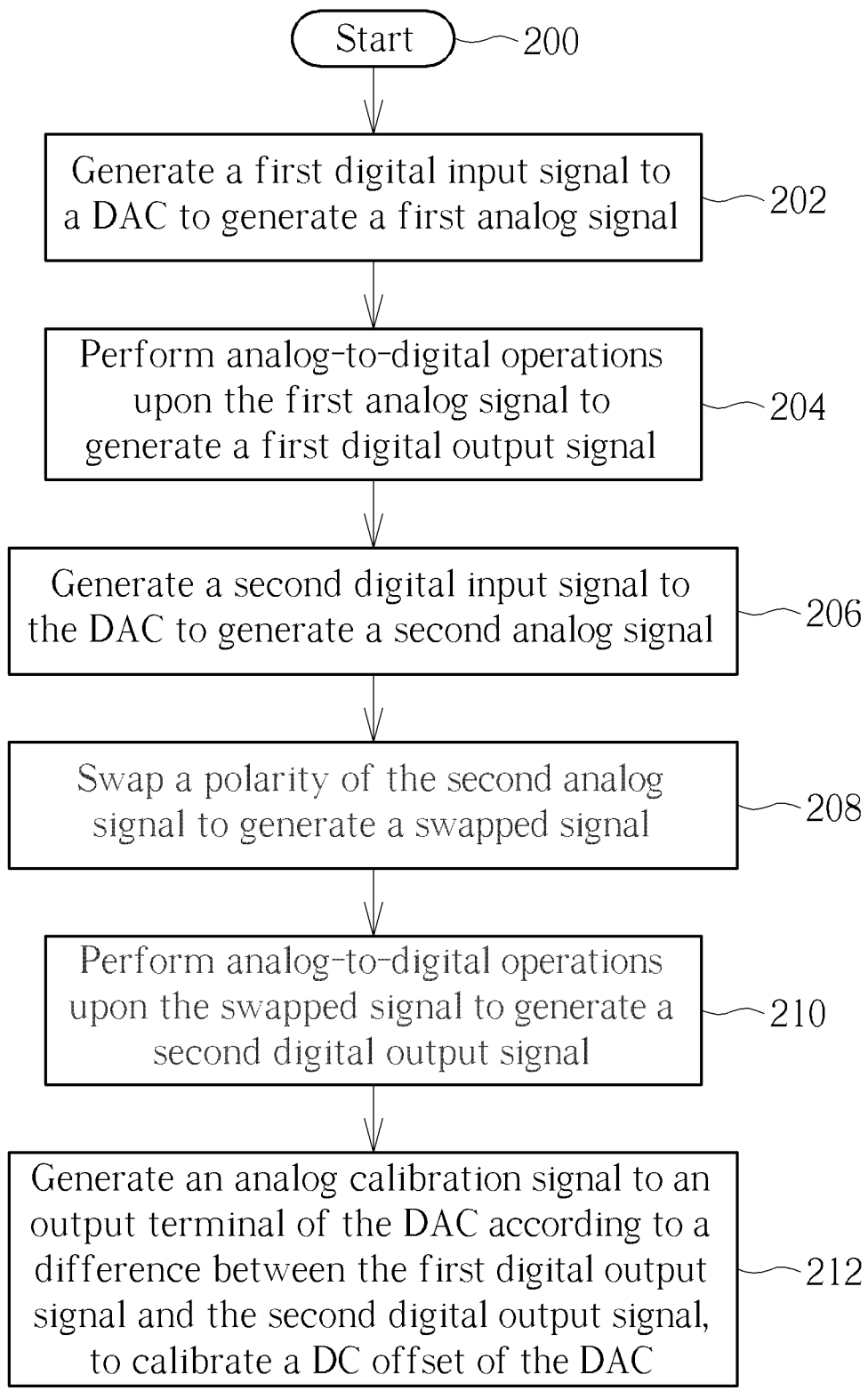
FIG. 2 is a flowchart of a calibration method applied to a DAC according to one embodiment of the present invention.

FIG. 2 is a flowchart of a calibration method applied to a DAC according to one embodiment of the present invention. Referring to the contents in the above embodiments, the calibration method is described as follows.

Step 200: the flow starts.

Step 202: generate a first digital input signal to a DAC to generate a first analog signal.

Step 204: perform analog-to-digital operations upon the first analog signal to generate a first digital output signal.

Step 206: generate a second digital input signal to the DAC to generate a second analog signal.

Step 208: swap a polarity of the second analog signal to generate a swapped signal.

Step 210: perform analog-to-digital operations upon the swapped signal to generate a second digital output signal.

Step 212: generate an analog calibration signal to an output terminal of the DAC according to a difference between the first digital output signal and the second digital output signal, to calibrate a DC offset of the DAC.

Figure 3:
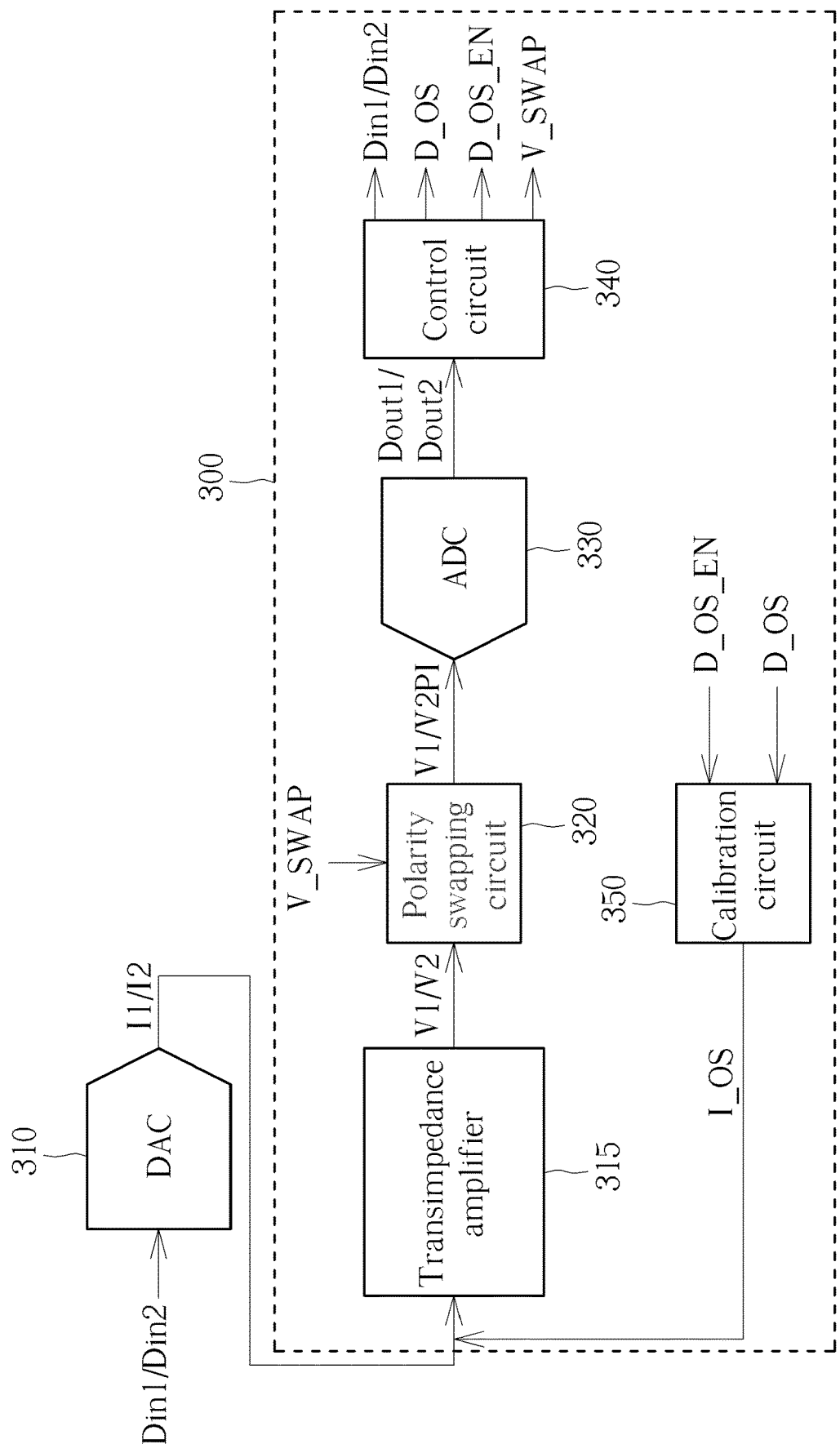
FIG. 3 is a diagram illustrating a circuit for calibrating a DAC according to another embodiment of the present invention.
Figure 4:
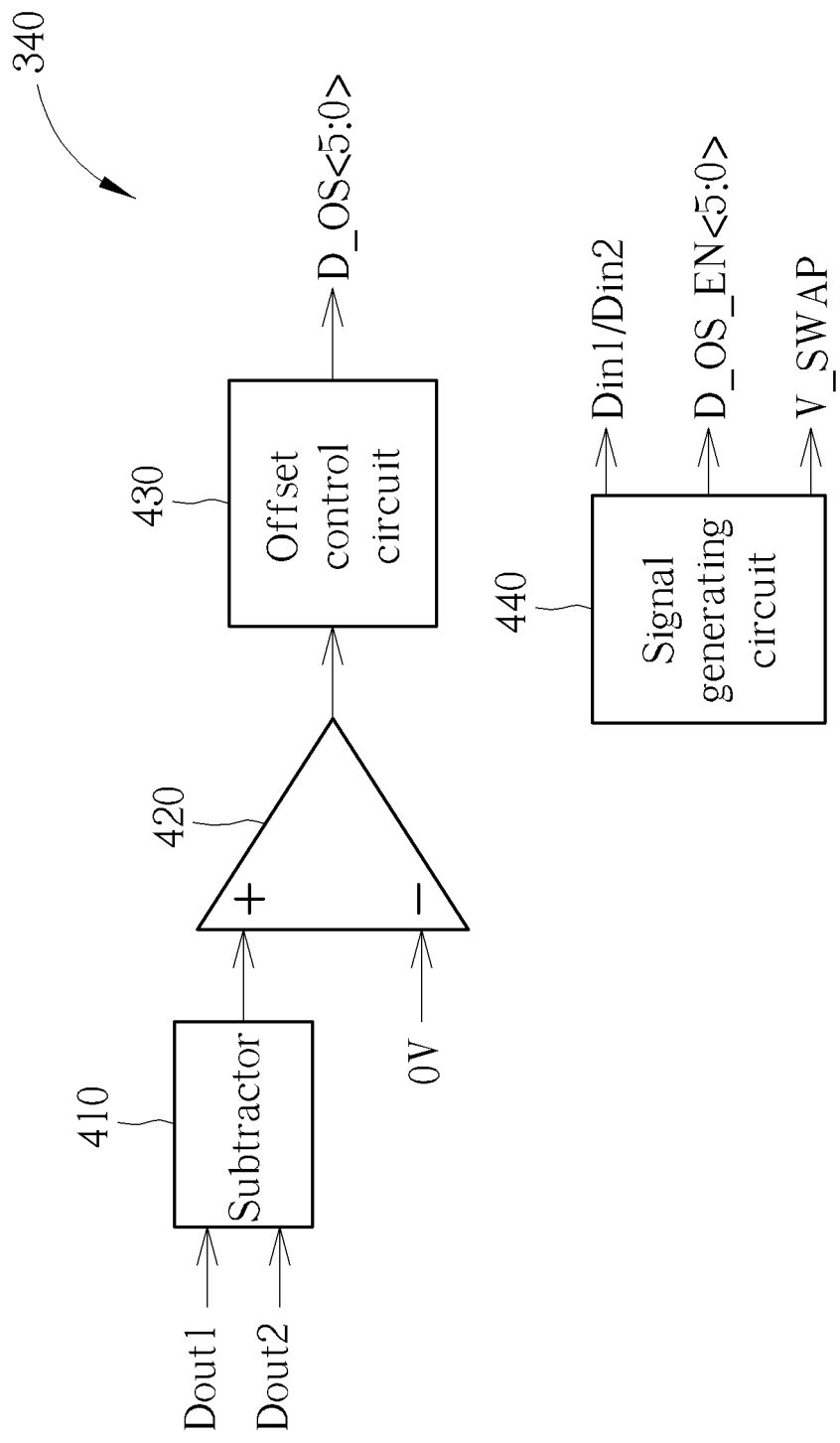
FIG. 4 is a diagram illustrating a control circuit according to one embodiment of the present invention.

FIG. 3 is a diagram illustrating a circuit 300 arranged to calibrate a DAC 310 according to one embodiment of the present invention. As shown in FIG. 3, the circuit 300 comprises a transimpedance amplifier 315, a polarity swapping circuit 320, an ADC 330, a control circuit 340 and a calibration circuit 350. In this embodiment, the DAC 310 and the circuit 300 are positioned in a transmitter or a transceiver within a communication device. FIG. 4 shows the control circuit 340 according to one embodiment of the present invention. As shown in FIG. 4, the control circuit 340 comprises a subtractor 410, a comparator 420, an offset control circuit 430 and a signal generating circuit 440.

In the embodiment shown in FIG. 3, the circuit 300 is used to calibrate the DAC 310 to compensate the DC offset of the DAC 310 during a specific time, such as when the communication device is powered on. After the calibrations are completed, the circuit 300 can be disabled, and the output of the DAC 310 can be directly used by other components within the communication device.

The operations of the circuit 300 are similar to the circuit 100 shown in FIG. 1. The main difference is that the control circuit 340 adjusts only one bit of the digital calibration signal D_OS after calculating the difference between the first digital output signal Dout1 and the second digital output signal Dout2, to generate the corresponding analog calibration signal I_OS to calibrate the DC offset of the DAC 310. That is, the control circuit 340 calculates the difference between the first digital output signal Dout1 and the second digital output signal Dout2 many times, and then sequentially adjusts the remaining bits of the digital calibration signal D_OS to make the analog calibration signal I_OS approach an ideal value.

Figure 5:
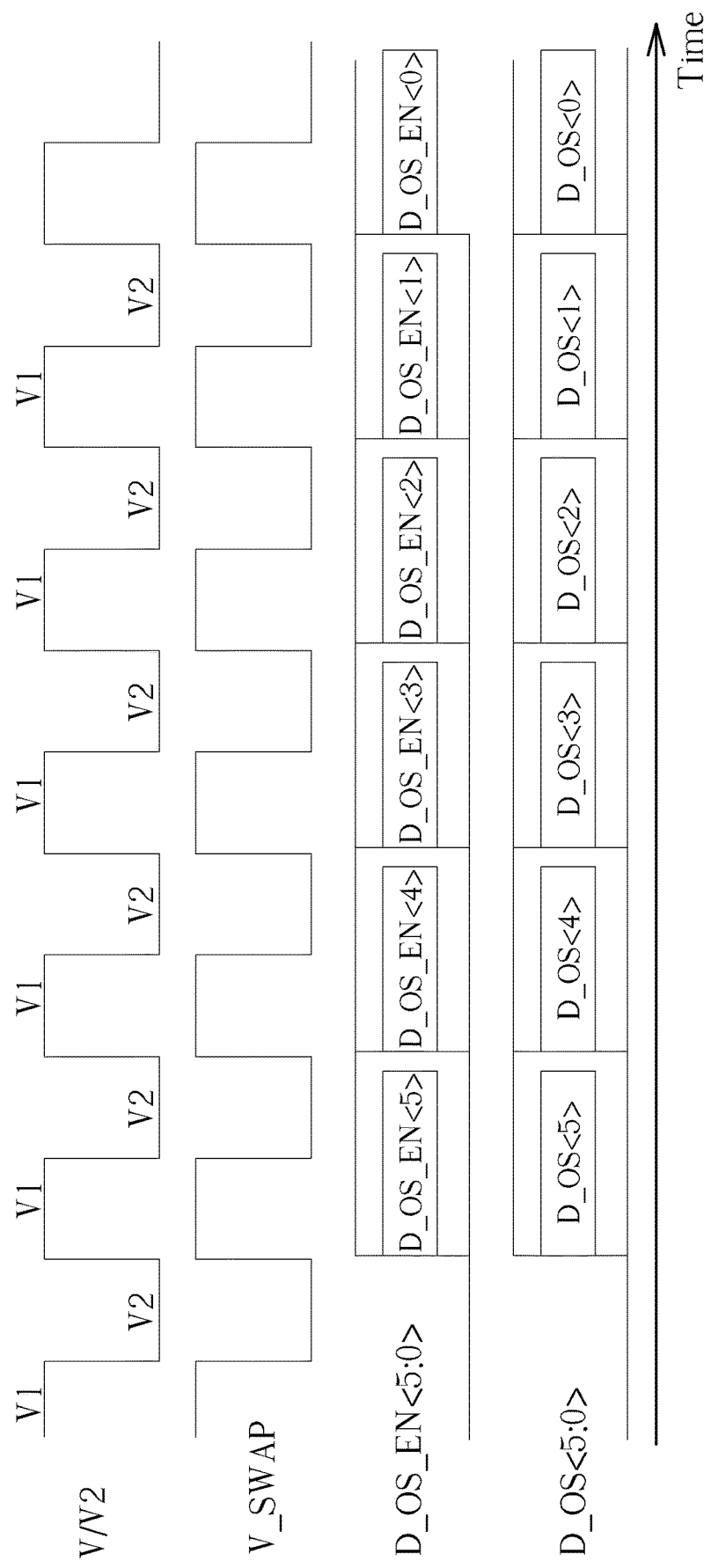
FIG. 5 is a timing diagram of some signals shown in FIG. 3 and FIG. 4.

Regarding the operations of the circuit 300, referring to FIGS. 3-5 together, wherein FIG. 5 is a timing diagram of some signals. First, the signal generating circuit 440 in the control circuit 340 generates a first digital input signal Din1 to the DAC 310 to generate a first current signal I1 to the transimpedance amplifier 315 to generate a first analog signal V1 (voltage Signal). At this time, the signal generating circuit 440 generates the control signal V_SWAP to disable the polarity swapping circuit 320 to transmit the first analog signal V1 to the ADC 330. Then, the ADC 330 performs the analog-to-digital converting operations upon the first analog signal V1 to generate a first digital output signal Dout1 to the control circuit 340. In this embodiment, an example of the first digital input signal Din1 and the first digital output signal Dout1 can be referred to the embodiment of FIG. 1.

Then, the signal generating circuit 440 generates a second digital input signal Din2 to the DAC 310 to generate a second current signal I2 to the transimpedance amplifier 315 to generate a second analog signal V2 (voltage signal). At this time, the signal generating circuit 440 generates the control signal V_SWAP to enable the polarity swapping circuit 320 to swap the polarity of the second analog signal V2 to generate a swapped signal V2PI into the ADC 330. Then, the ADC 330 performs the analog-to-digital converting operations upon the swapped signal V2PI to generate a second digital output signal Dout2 to the control circuit 340. In this embodiment, an example of the second digital input signal Din2 and the second digital output signal Dout2 can refer to the embodiment of FIG. 1.

Then, the subtractor 410 in the control circuit 340 subtracts the first digital output signal Dout1 and the second digital output signal Dout2 to generate a difference signal to the comparator 420 to be compared with a reference voltage (in this embodiment, the reference voltage is 0V) to generate a comparison signal to the offset control circuit 430 to generate a first bit (e.g., most significant bit (MSB)) of the digital correction signal D_OS<5:0> (In this embodiment, it is assumed that the calibration signal is a 6-bit digital signal), wherein the comparison signal can reflect the polarity/direction of the DC offset of the DAC 310. At this time, the signal generating circuit 440 also generates the enable signal D_OS_EN<5> to the calibration circuit 350 to control the correction circuit 350 to generate the analog calibration signal I_OS to compensate the output terminal of the DAC 310 according to the digital calibration signal D_OS<5>. In this embodiment, the analog calibration signal I_OS is a current that is directly connected to the output terminal of the DAC 310 to adjust the output current of the DAC 310.

Then, the circuit 300 repeats the above steps to sequentially generates other bits D_OS<4>-D_OS<0> of the digital calibration signal D_OS, and sequentially generates the enable signals D_OS_EN<4>-D_OS_EN<0> to the calibration circuit 350, and the calibration circuit 350 can sequentially updates the current value of the analog calibration signal I_OS according to other bits D_OS<4>-D_OS<0> of the digital calibration signal D_OS.

The circuit 300 of FIG. 3 can make the analog calibration signal I_OS approach the ideal value in a continuous approximation manner, so that the problem of mismatching characteristics of the DAC 310 and the ADC 330 can be avoided.

In another embodiment with respect to FIGS. 3-5, if the standard is reached in advance during the DC offset compensation, for example, the DC offset has met the standard after the digital calibration signal D_OS<3> is generated. Then, the next enable signal D_OS_EN<2>-D_OS_EN<0> will be turned off (i.e. not used), and it is no longer necessary to continue generating the remaining bits of the digital calibration signal D_OS.

Briefly summarized, in the circuit and calibration method applied to the DAC of the present invention, by using the particular digital input signals and the polar swapping operations, the influence of the DC offset of the ADC in the calibration process can be eliminated, so that the DC offset calibration of the DAC can be more accurate. In addition, in this embodiment, the DC offset calibration is directly performed on the analog output of the DAC, so that the input signal range of the DAC will not be influenced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibration method applied to a digital-to-analog converter (DAC), comprising:
   (a) generating a first digital input signal to the DAC to generate a first analog signal;
   (b) using an analog-to-digital converter (ADC) to generate a first digital output signal according to the first analog signal;
   (c) generating a second digital input signal to the DAC to generate a second analog signal, wherein the second digital input signal is different from the first digital input signal;
   (d) swapping a polarity of the second analog signal to generate a swapped signal;
   (e) using the ADC to generate a second digital output signal according to the swapped signal; and
   (f) generating a digital calibration signal according to the first digital output signal and the second digital output signal, to control a calibration circuit to generate an analog calibration signal or to determine a polarity direction of a DC offset that is to be calibrated.

2. The calibration method of claim 1, wherein the digital calibration signal is used to control the control circuit to generate the analog calibration signal to calibrate/compensate an output signal of the DAC.

3. The calibration method of claim 2, wherein the analog calibration signal is a current signal, and the analog calibration signal is used to calibrate/compensate a DC offset of the DAC.

4. The calibration method of claim 2, wherein the first digital input signal is an intermediate value of a digital input code range of the DAC plus a digital offset value, and the second digital input signal is the intermediate value minus the digital offset value.

5. The calibration method of claim 2, wherein the first digital input signal is an intermediate value of a digital input code range of the DAC minus a digital offset value, and the second digital input signal is the intermediate value plus the digital offset value.

6. The calibration method of claim 2, wherein the step (f) comprises:
   generating the digital calibration signal to the calibration circuit according to a difference between the first digital output signal and the second digital output signal, to generate the analog calibration signal to calibrate/compensate the output signal of the DAC.

7. The calibration method of claim 6, wherein the step (f) comprises:
   (g) generating one bit of the digital calibration signal according to the difference between the first digital output signal and the second digital output signal; and
   (h) referring to the digital calibration signal to generate the analog calibration signal to an output terminal of the DAC.

8. The calibration method of claim 7, further comprising:
   repeating the steps (a), (b), (c), (d), (e) and (g) to generate other bit(s) of the digital calibration signal.

9. The calibration method of claim 1, wherein the steps (a) and (b) are executed before the steps (c), (d) and (e); or the steps (a) and (b) are executed after the steps (c), (d) and (e).

10. A circuit applied to a digital-to-analog converter (DAC), comprising:
   a control circuit, for generating a first digital input signal and a second digital input signal to the DAC to generate a first analog signal and a second analog signal, respectively, wherein the second digital input signal is different from the first digital input signal;
   a polarity swapping circuit, coupled to the control circuit, for swapping a polarity of the second analog signal to generate a swapped signal;
   an analog-to-digital converter (ADC), coupled to the polarity swapping circuit and the control circuit, for generating a first digital output signal according to the first analog signal, and generating a second digital output signal according to the swapped signal;

the control circuit further generates a digital calibration signal or determines a DC offset that is to be calibrated according to the first digital output signal and the second digital output signal; and a calibration circuit, coupled to the ADC, for generating an analog calibration signal according to the digital calibration signal.

11. The circuit of claim 10, wherein the control circuit generates the analog calibration signal according to the digital calibration signal, to calibrate/compensate an output signal of the DAC.

12. The circuit of claim 11, wherein the analog calibration signal is a current signal, and the analog calibration signal is used to calibrate/compensate a DC offset of the DAC.

13. The circuit of claim 11, wherein the first digital input signal is an intermediate value of a digital input code range of the DAC plus a digital offset value, and the second digital input signal is the intermediate value minus the digital offset value.

14. The circuit of claim 11, wherein the first digital input signal is an intermediate value of a digital input code range of the DAC minus a digital offset value, and the second digital input signal is the intermediate value plus the digital offset value.

15. The circuit of claim 11, wherein the control circuit generates the digital calibration signal according to a difference between the first digital output signal and the second digital output signal, and the calibration circuit generates the analog calibration signal according to the digital calibration signal to calibrate/compensate the output signal of the DAC.

16. The circuit of claim 15, wherein the control circuit generates one bit of the digital calibration signal according to the difference between the first digital output signal and the second digital output signal, and the calibration circuit refers to the digital calibration signal to generate the analog calibration signal to an output terminal of the DAC.

17. The circuit of claim 16, wherein the control circuit repeatedly generates the first digital input signal and the second digital input signal to the DAC to generate the first analog signal and the second analog signal, respectively, and the ADC generates the corresponding first digital output signal and the second digital output signal, and the control circuit uses the first digital output signal and the second digital output signal to generate other bit(s) of the digital calibration signal.

18. The circuit of claim 10, wherein the calibration circuit and the DAC is positioned in a transmitter or a transceiver.

* * * * *